United States Patent [19]
Den et al.

[11] Patent Number: 5,512,542
[45] Date of Patent: Apr. 30, 1996

[54] METALLIC OXIDE WITH BORON AND PROCESS FOR MANUFACTURING THE SAME

[75] Inventors: Tohru Den, Tokyo; Norio Kaneko, Atsugi; Tamaki Kobayashi, Isehara, all of Japan

[73] Assignee: Canon Kabushiki Kaisha, Tokyo, Japan

[21] Appl. No.: 297,767

[22] Filed: Aug. 30, 1994

[30] Foreign Application Priority Data

Sep. 2, 1993 [JP] Japan ................................ 5-218627

[51] Int. Cl.$^6$ ........................... H01B 12/00; C04B 35/45; C04B 35/50; C01B 35/12
[52] U.S. Cl. ........................ 505/125; 505/126; 505/777; 505/779; 505/780; 505/500; 505/778; 252/521; 501/98; 501/123; 501/152; 501/50
[58] Field of Search ............................ 252/521; 505/125, 505/126, 777, 778, 779, 780, 500; 501/98, 123, 152, 50; 423/279, 280, 277, 288

[56] References Cited

FOREIGN PATENT DOCUMENTS 4120263  9/1992  Germany .

OTHER PUBLICATIONS

D. C. Johnston, et al., "High Temperature Superconductivity In the Li–Ti–O Ternary System", Mat. Res. Bull., vol. 8, No. 7, pp. 777–784, 1973.
A. W. Sleight, et al., "High–Temperature Superconductivity In the BaPb$_{1-x}$Bi$_x$O$_3$ System", Solid State Comm. vol. 17, pp. 27–28, 1975.
J. G. Bednorz, et al., "Possible High T$_c$ Superconductivity in the Ba–La–Cu–O System", Z. Phys.B.–Cond. Matter, vol. 64, pp. 189–193 (1986) (Sep.).
M. K. Wu, et al., "Superconductivity at 93K in a New Mixed–Phase Y–Ba–Cu–O Compound System at Ambient Pressure", Phys. Rev. Ltrs., vol. 58, No. 9, pp. 908–912 (Mar. 1987).
W. J. Zhu, et al., "(B,Cu)Sr$_2$YCu$_2$O$_7$, a new layered copper–oxide based on the boron–oxygen group", Physica C 205, pp. 118–122 (1993).
I. Amato, "New Superconductors: A Slow Dawn". Science, vol. 259, pp. 306–308 (Jan. 1993).
Database WPI, Week 9246, Derwent Publ., AN 92–376638, based on JPA–4275972.
Database WPI, Week 8914, Derwent Publ., AN 89–104077, based on JPA–1051322.

*Primary Examiner*—Douglas J. McGinty
*Attorney, Agent, or Firm*—Fitzpatrick, Cella, Harper & Scinto

[57] ABSTRACT

A novel metallic oxide of a Ln-Ca-Sr-Ba-Cu-B-O type and a process for manufacturing such a metallic oxide. The above metallic oxide has a composition expressed by the following formula (I):

$$(Ln_{1-a}Ca_a)(Sr_{2-b}Ba_b)(Cu_{3-c}B_c)O_d \qquad (I)$$

wherein Ln is one or more kinds of elements selected from the group consisting of Y and lanthanoid elements except for Ce and Tb and wherein the following conditions are met: $0.1 \leq a \leq 0.5$, $0.7 \leq b \leq 1.7$, $0.1 \leq c \leq 0.5$, and $6.5 \leq d \leq 7.5$. A process for manufacturing the metallic oxide has the following steps. A mixture of materials including $H_3BO_3$ used as a starting material of B is prepared. The resultant mixture is heated at a rate of 5° C. or lower per minute up to 900° C. or lower. Then, it is heated in an oxygen atmosphere at a range from 900°–1050° C.

8 Claims, 2 Drawing Sheets

FIG. 2

———————— Y , Ca LAYER ————————
———————— $CuO_2$ LAYER ————————
———————— (Sr , Ba) O LAYER ————————
———————— (Cu , B) O LAYER ————————
———————— (Sr , Ba) O LAYER ————————
———————— $CuO_2$ LAYER ————————
———————— Y , Ca LAYER ————————

METALLIC OXIDE WITH BORON AND PROCESS FOR MANUFACTURING THE SAME

BACKGROUND OF THE INVENTION

1. Field of the Invention

The present invention relates to a novel metallic oxide and to a process for manufacturing such a metallic oxide, and more particularly, to a boron-containing metallic oxide and to a process for manufacturing such a metallic oxide. Also, the invention can be used in a superconducting material and is also applicable to various fields, such as sensors, electronic devices, computers, medical instruments, magnets, transmission lines, energy equipment, voltage standard, and the like. Further, the metallic oxide of the present invention is particularly effective in the form of a wire and a thick film and is also applicable when it is bonded with or dispersed in other oxides or metals.

2. Description of the Related Art

Copper-containing metallic oxide superconducting materials have been discovered one after another in recent years. Such materials have much higher superconducting critical temperatures (Tc) than those of conventionally-known niobium-type materials. Because of this advantage, various research has been made to apply such materials in many fields.

Among these copper-containing metallic oxide superconducting materials, the following types are particularly known: $YBa_2Cu_3O_y$ referred to as the Y type, $Bi_2Sr_2Ca_nCu_{1+n}O_y$ (n=0,1,2,) referred to as the Bi type, $Tl_2Ba_2Ca_nCu_{1+n}O_y$ (n=0,1,2) referred to as the Tl type, and the like. Research is currently in progress to put these types of materials to practical use.

Also, in particular, as a boron (B)-containing metallic oxide superconducting material, Physica C, Vol.205 (1993), p.118–122 introduces a material having a composition of $YSr_{0.8}Ba_{1.2}Cu_{2.5}B_{0.5}O_7$ and a superconducting critical temperature Tc of 51K.

Among the above-noted metallic oxide superconducting materials, the Y-type and Tl-type materials present the following problem when applied to superconducting wires or magnetic shield thick films. The crystal grains in the grain boundary tend to bond weakly with each other, that is, they suffer from, what is called, "a weak link", thereby resulting in a failure to increase the critical current density. Such a conventional problem is disclosed in SCIENCE Vol.259 (1993) p.306–308 and INDUSTRIAL MATERIAL Vol.41 (1993.3) p.18–25, and the like.

Further, among the foregoing metallic oxide superconducting materials, when the Bi type is applied to a wire or a thick film, unlike the Y type and Tl type, the crystal grains in the grain boundary are unlikely to suffer from a weak link, thus exerting outstanding two-dimensional crystalline characteristics, thereby enhancing the easy application of the Bi type to a wire. On the other hand, however, the Bi type has a problem in that the critical current density significantly decreases in the magnetic field. This symptom becomes particularly noticeable at a magnetic field of 1 tesla or more and at a temperature of 30K or more, thus significantly hampering applications of the Bi type to important fields, for example, to a superconducting magnet. Such a conventional problem is also disclosed in detail in SCIENCE Vol.259 (1993) p.306–308 and INDUSTRIAL MATERIAL Vol. 41 (1993.3) p. 18–25 and p. 26–31, and the like.

Taking such current conditions into consideration, it is confirmed that for application to a magnet, or the like, it is important to develop a Y-type material which will not be likely to suffer from a weak link.

SUMMARY OF THE INVENTION

Accordingly, an object of the present invention is to provide a novel superconducting material which is unlikely to suffer from a weak link although it is a Y-type material, thus enhancing an increase in the critical current density.

Another object of the present invention is to provide a process for manufacturing a metallic oxide which excels in the above-mentioned characteristics.

To achieve the above objects, the present invention provides a metallic oxide characterized by having a composition expressed by the following formula (I):

$$(Ln_{1-a}Ca_a)(Sr_{2-b}Ba_b)(Cu_{3-c}B_c)O_d \qquad (I)$$

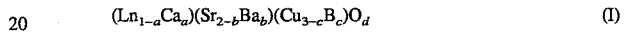

wherein Ln is one or more kinds of elements selected from the group consisting of Y and lanthanoid elements except for Ce and Tb and wherein the following conditions are met:

$$0.1 \leq a \leq 0.5,\ 0.7 \leq b \leq 1.7,\ 0.1 \leq c \leq 0.5,\ \text{and}\ 6.5 \leq d \leq 7.5$$

The present invention also provides a process for manufacturing a metallic oxide of the type which has components including Ln as one or more kinds of elements selected from the group consisting of Y and lanthanoid elements except for Ce and Tb and also including Ca, Sr, Ba, Cu, B and O, the process comprising the steps of: preparing a mixture of materials including $H_3BO_3$ used as a starting material of B; heating the resultant mixture at a rate of 5° C. or lower per minute up to 900° C. or lower; and heating the mixture in an oxygen atmosphere at a range from 900° C. to 1050° C.

The present invention further provides a process for manufacturing a metallic oxide of the type which has a composition expressed by the following formula (I), the process comprising the steps of: preparing a mixture of materials including $H_3BO_3$ used as a starting material of B; heating the resultant mixture at a rate of 5° C. or lower per minute up to 900° C. or lower; and heating the mixture in an oxygen atmosphere at a range from 900° C. to 1050° C.

$$(Ln_{1-a}Ca_a)(Sr_{2-b}Ba_b)(Cu_{3-c}B_c)O_d \qquad (I)$$

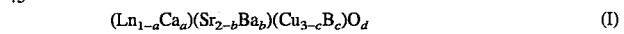

wherein Ln is one or more kinds of elements selected from the group consisting of Y and lanthanoid elements except for Ce and Tb and wherein the following conditions are met:

$$0.1 \leq a \leq 0.5,\ 0.7 \leq b \leq 1.7,\ 0.1 \leq c \leq 0.5,\ \text{and}\ 6.5 \leq d \leq 7.5$$

Further objects, features and advantages of the present invention will become apparent from the following description of the preferred embodiments with reference to the attached drawings.

BRIEF DESCRIPTION OF THE DRAWINGS

FIG. 2 is a schematic view of a layer structure as viewed in the vertical direction of the c-axis of the crystal structure of a sample according to Example 1 which has been examined with TEM.

PREFERRED EMBODIMENTS

Figure 1:
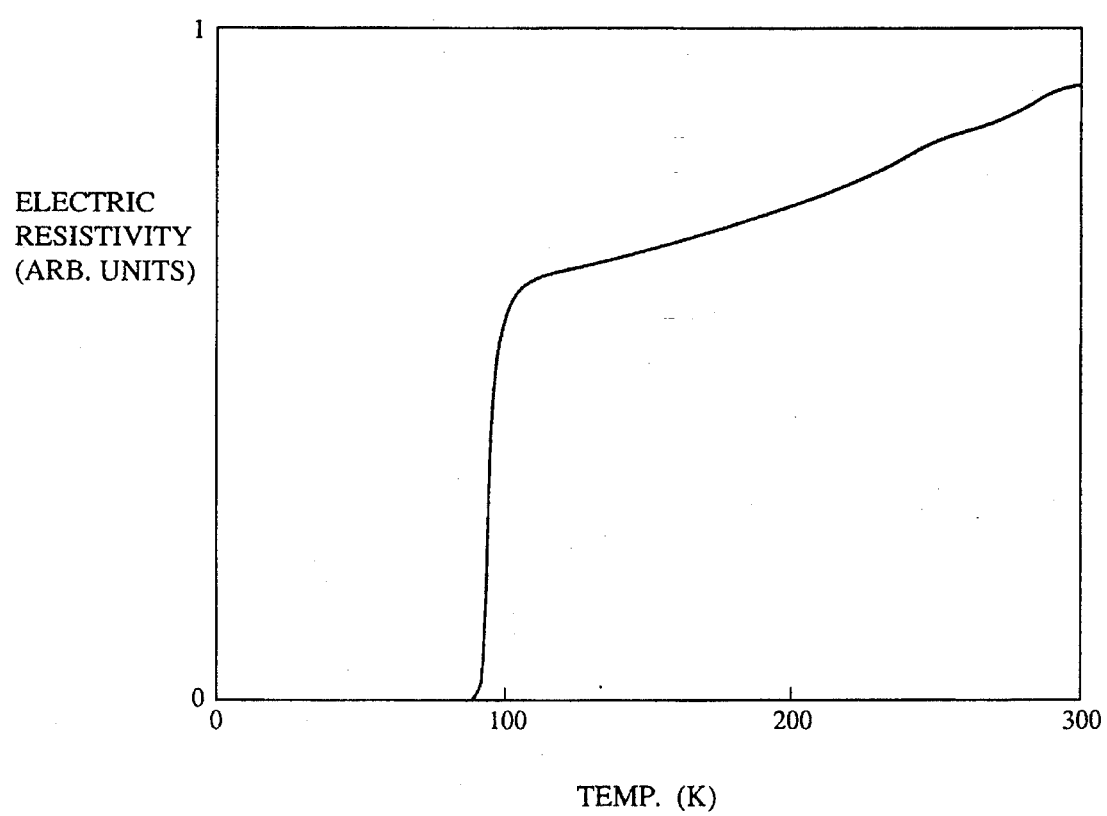
FIG. 1 is a graph indicating the temperature dependency of electric resistivity of a sample according to Example 1.

Among copper-containing metallic oxide superconducting materials, the Y-type 123 structure ($YBa_2Cu_3O_7$) includes copper sites in crystallographically different conditions. A first site is Cu in "$CuO_2$ sheet" which is closely related to superconducting and of great use for achieving superconductivity. The $CuO_2$ sheet is an essential component for a copper-containing metallic oxide superconductive material. A second site is present in a component in which copper and oxygen atoms are alternately arranged in the form of a one-dimensional chain, what is called, "the Cu-O chain layer". The second-mentioned Cu in this Cu-O chain layer is in contrast to the first-mentioned Cu in the $CuO_2$ sheet which Cu forms a two-dimensional network via oxygen. As described above, although the above two types of copper sites are present together with oxygen substantially in the same plane, the first site forms a two-dimensional network and the second site forms a one-dimensional chain. Such different forms can be understood from the positional relationships between the first site and the Y layer and the Ba-O layer composed of Y and Ba elements, respectively, and between the second site and the Ba-O layer, which layers are present at the upper and lower of the sites. That is, the $CuO_2$ sheet is sandwiched between the Y layer and the Ba-O layer, while the Cu-O chain layer is sandwiched between the Ba-O layer and the Ba-O layer.

It should be noted that oxygen atoms in the Cu-O chain layer likely to be lost in the above structure. Such a loss of oxygen atoms brings about a decrease in the carrier density which carriers serve the function of achieving superconductivity, thereby decreasing the superconducting transition temperature or varying the length of the crystal axis. The Y-type also includes other superconducting phases, what is called, "the 124 structure ($YBa_2Cu_4O_8$)" in which the Cu-O chain layer is doubled, and what is called, "the 247 structure ($Y_2Ba_4Cu_7O_{15}$) in which the Cu-O chain layer is doubled every other layer. Such superconducting phases are considerably stable and have different superconducting characteristics and crystal structures from those of the 123 structure. That is, it is assumed that the 123 structure becomes unstable owing to this Cu-O chain layer. Because of this instability, oxygen is likely to be missing in the grain boundary and another crystal structure is likely to precipitate, thus bringing about a reduction in the critical current density, what is called, "a weak link".

The present inventors noted that this unstable Cu-O chain layer would be stabilized while maintaining its function of a layer composing a superconducting material. They succeeded in synthesizing a novel metallic oxide superconducting material by replacing a part of Cu of the Cu-O chain layer at random or periodically by B to form the B-O bond which would be expected to be more stable than the Cu-O bond. The metallic oxide of the present invention is referred to as "the novel 123 structure" because the oxygen atoms in this structure are present in different positions from those of the above Y-type 123 structure, and also, the length of the crystal axis of the former structure considerably differs from that of the latter. From this point of view, this novel structure may be more suitable to be referred to as "the 1212 structure". Further, the present inventors found out that in order to maintain this 1212 structure while containing boron, and also to supply sufficient carriers to achieve superconductivity, it would be necessary to replace a part of Ba by Sr which is also an alkali earth metal and which ion radius is smaller than that of Ba, and also necessary to replace a part of Ln site (Y) by divalent Ca which has a smaller number of valences than Y. According to the above-noted Physica C Vol.205 (1993) p. 118–122, the Y site cannot be replaced by Ca. However, the present inventors discovered that the amount of replacing boron and the ratio of Ba to Sr would be suitably determined, thereby enabling the replacement of the Y site by Ca, thus obtaining a metallic oxide at a far higher superconducting transition temperature Tc than 51K of the metallic oxide which is described in the above thesis.

Various starting materials may be employed to synthesize the metallic oxide of the present invention. The present inventors further found out the following point regarding the starting materials and the following steps to obtain the metallic oxide. $H_3BO_3$ was particularly used as a material of boron (B) and mixed with other materials of Ln, Ca, Sr, Ba and Cu. Then, the temperature of the resultant mixture was gradually raised so that the mixture was temporarily fired at a lower temperature than that at which final firing is performed, followed by being finally fired in oxygen, thus obtaining the foregoing metallic oxide having good superconducting characteristics.

A detailed description will now be given of the preferred mode for carrying out the invention.

The present invention based on the above discoveries made by the present inventors is a metallic oxide characterized by having a composition which meets the condition of the following formula (I):

$$(Ln_{1-a}Ca_a)(Sr_{2-b}Ba_b)(Cu_{3-c}B_c)O_d \quad (I)$$

wherein Ln is one or more kinds of elements selected from the group consisting of Y and lanthanoid elements (except for Ce and Tb) and wherein the following conditions are met:

$$0.1 \leq a \leq 0.5, \ 0.7 \leq b \leq 0.7, \ 01 \leq c \leq 0.5, \text{ and } 6.5 > d \leq 7.5$$

Any metallic oxide is possible for the present invention as long as it has the foregoing composition expressed by the formula (I). Among others, the preferable metallic oxide meets the conditions of a composition in which Ln is one of Y, Gd, Dy, Ho and Er and $0.2 \leq a \leq 0.4$, $1.0 \leq b \leq 1.4$ and $0.2 \leq c \leq 0.4$.

Although the metallic oxide of the present invention as described above has different superconducting transition temperatures depending on the firing conditions and composition, it exceeds 90K at the optimal composition. Hence, this metallic oxide can be used as a superconducting material not only at a liquid nitrogen temperature, but also in a simple cooler.

Further, the critical current density of the metallic oxide is greater than that of the conventional Y-type ($YBa_2Cu_3O_7$). This substantiates that the metallic oxide of the present invention is more improved in the weak link in the grain boundary than the conventional Y-type material. The below-mentioned critical current density ratio ($\alpha$) is $\alpha \geq 1.1$, preferably, ($\alpha \geq 1.5$, and more preferably, $\alpha \geq 2.0$. Also, the metallic oxide of the present invention has a critical current density 100 times greater than the boron (B)-containing material ($YSr_{0.8}Ba_{1.2}Cu_{2.5}B_{0.5}O_7$) introduced in the above-noted Physica C Vol. 205 (L993) p. 118–122.

An explanation will now be given of a process for manufacturing the metallic oxide of the present invention.

A process for manufacturing the boron (B)-containing metallic oxide is employed whereby $B_2O_3$, or the like, used as a boron starting material, is allowed to thermally react with powder materials, which is called, "solid state reaction", being generally used in ceramics materials, and is sintered. Examples of such a manufacturing process are disclosed in Material Research Bulletin Vol.8 (1973) P.777, Solid State Communication Vol.17 (1975) p. 27, Zeitschrift fur Physik Vol. 64 (1986) p. 189, Physical Review Letters Vol.58 (1987) p.908, and the like. Such processes are currently known to be qualitatively" extremely typical. The process for manufacturing a metallic oxide according to the present invention is employed whereby the respective materials are mixed at a suitable ratio to obtain the material which meets the condition of the foregoing formula (I), thereby manufacturing a metallic oxide by the above typical thermal reaction and sintering process.

For the development of the present invention, in order to achieve a metallic oxide which is particularly excellent in superconducting characteristics, the following manufacturing process is preferable. $H_3BO_3$ is particularly used as a starting material of boron (B) and mixed with other materials of Ln, Ca, Sr, Ba and Cu at a suitable composition ratio. Then, the temperature of the resultant mixture is gradually raised so that the mixture is temporarily fired at a temperature equivalent to or lower than that at which final firing is performed, followed by being finally fired in oxygen. More specifically, after the above-noted materials are mixed, the temperature is raised at a rate of 5° C. or lower per minute and the mixture is temporarily fired at lower than 900° C. Then, it is finally fired in oxygen at a temperature in a range from 900° C. to 1050° C. That is, although the metallic oxides have the same composition, they exhibit different superconducting characteristics due to variations in the size of crystal grains forming the metallic oxides and the bonding states of the grains, which variations result from different manufacturing conditions. According to the manufacturing process of the present invention, it is possible to obtain a metallic oxide which particularly excels in superconducting characteristics among metallic oxides of the present invention.

The manufacturing process for the present invention is not limited to the foregoing steps, and instead, the process for manufacturing the Y-type metallic oxide may have, for example, a step of annealing in oxygen at a low temperature from 500° to 700° C., thereby improving characteristics of such a Y-type metallic oxide.

Also, when the metallic oxide of the present invention is used in a substrate for a superconducting electronic device, the following process may also be applicable to the present invention. Material powder is melted by use of a flux, or the like, at a high temperature so as to grow a single crystal.

Further, when the metallic oxide of the present invention is used in a thin film electronic device or shield material, it may be formed in a thin film-shape on a substrate or a superconducting thin film according to the following processes: sputtering, for example, high-frequency sputtering using a material-containing target and magnetron sputtering, electron beam deposition, MBE, other vacuum deposition processes, cluster ion beam, CVD using a gas as a material, plasma CVD, or the like.

The present invention will now be more specifically described with reference to examples and comparative examples.

EXAMPLES 1–16

Comparative Examples 1–14

$Y_2O_3$, $Gd_2O_3$, $CeO_2$, $Tb_4O_7$, $Sc_2O_3$, $CaCO_3$, $SrCO_3$, $BaCO_3$, CuO and $H_3BO_3$ used as starting materials were weighed at a suitable composition ratio and then dry-mixed. The resultant mixtures of the respective examples and comparative examples were pressure-molded into pellets each having a diameter of Ø 10 mm and a thickness of 1 mm. The resultant moldings were allowed to react and sintered on an alumina boat in an oxygen gas at a temperature from 850° to 1000° C., thus preparing metallic oxides of the examples and comparative examples. These samples underwent measurement for the electric resistivity in a range from room temperature to liquid helium temperature by a four-terminal method. They also underwent average evaluation of the compositions by EPMA, the volume of oxygen having an error of approximately 20% due to the performance of the EPMA. Further, the critical current density of each of the samples was determined under the same conditions by measuring the susceptibility of SQUID or the DC four-terminal method. The resultant current density "was indicated by the ratio based on the critical current density of the typical Y-type material, that is, $YBa_2Cu_3O_7$ of Comparative Example 1, at 50K, for comparison.

Table 1 shows the composition, the critical current density ratio α and the superconducting transition temperature Tc(K) of each of the examples. Table 2 shows the nominal composition, the critical current density ratio α and the electrical characteristics or the superconducting transition temperature Tc(K) of each of the comparative examples, the transition temperature Tc(K) being shown only when the comparative examples shows a superconducting transition.

As is seen from Table 1, all the metallic oxides of the present invention exhibit the superconducting transition at a temperature of Tc=60K or higher. Also, the relative critical current density of all the metallic oxides exceeds 1 under the condition of 50K. It is thus verified that the superconducting materials of the present invention show signs of improvement compared to the conventional Y-type materials. Further, it is confirmed that superconducting characteristics of the present invention are superior because the critical current density ratio is 1.5 or more particularly when the composition ratio is $0.2 \leq a \leq 0.4$, $1.0 \leq b \leq 1.4$ and $0.2 \leq c \leq 0.4$ and the superconducting transition temperature exceeds 70K. It should be noted that the content of oxygen is preferably approximately d=7.

On the other hand, it is seen from the comparative examples of Table 2 that metallic oxides having the composition ratios other than those of the present invention have either a low critical current density or a low superconducting transition temperature Tc, or alternatively, both. That is, the metallic oxides of the comparative examples have a critical current density ratio α smaller than 1, in other words, they have poor superconducting characteristics, or alternatively, they do not show the superconducting transition, or if at all, they only show a low transition temperature Tc, that is, 60K or lower.

TABLE 1

| Example No. | Composition | Critical Current Density Ratio (α) | Tc (K) |
|---|---|---|---|
| 1 | $Y_{0.7}Ca_{0.3}Sr_{0.8}Ba_{1.2}Cu_{2.7}B_{0.3}O_7$ | 1.9 | 92 |
| 2 | $Y_{0.9}Ca_{0.1}Sr_{0.8}Ba_{1.2}Cu_{2.7}B_{0.3}O_{7.1}$ | 1.2 | 65 |
| 3 | $Y_{0.8}Ca_{0.2}Sr_{0.8}Ba_{1.2}Cu_{2.7}B_{0.3}O_{7.1}$ | 1.6 | 74 |
| 4 | $Y_{0.6}Ca_{0.4}Sr_{0.8}Ba_{1.2}Cu_{2.7}B_{0.3}O_{6.9}$ | 1.7 | 85 |
| 5 | $Y_{0.5}Ca_{0.5}Sr_{0.8}Ba_{1.2}Cu_{2.7}B_{0.3}O_{6.9}$ | 1.3 | 69 |
| 6 | $Y_{0.7}Ca_{0.3}Sr_{1.3}Ba_{0.7}Cu_{2.7}B_{0.3}O_7$ | 1.2 | 65 |
| 7 | $Y_{0.7}Ca_{0.3}Sr_{1.0}Ba_{1.0}Cu_{2.7}B_{0.3}O_7$ | 1.8 | 82 |
| 8 | $Y_{0.7}Ca_{0.3}Sr_{0.6}Ba_{1.4}Cu_{2.7}B_{0.3}O_7$ | 1.9 | 86 |
| 9 | $Y_{0.7}Ca_{0.3}Sr_{0.3}Ba_{1.7}Cu_{2.7}B_{0.3}O_7$ | 1.3 | 82 |
| 10 | $Y_{0.6}Ca_{0.4}Sr_{0.8}Ba_{1.2}Cu_{2.9}B_{0.1}O_{6.8}$ | 1.2 | 87 |

TABLE 1-continued

| Example No. | Composition | Critical Current Density Ratio ($\alpha$) | Tc (K) |
|---|---|---|---|
| 11 | $Y_{0.6}Ca_{0.4}Sr_{0.8}Ba_{1.2}Cu_{2.9}B_{0.1}O_{6.8}$ | 1.7 | 88 |
| 12 | $Y_{0.7}Ca_{0.3}Sr_{0.8}Ba_{1.2}Cu_{2.5}B_{0.4}O_{7.1}$ | 1.6 | 77 |
| 13 | $Y_{0.7}Ca_{0.3}Sr_{0.8}Ba_{1.2}Cu_{2.5}B_{0.5}O_{7.1}$ | 1.3 | 68 |
| 14 | $Y_{0.6}Ca_{0.4}Sr_{0.8}Ba_{1.2}Cu_{2.9}B_{0.1}O_{6.5}$ | 1.2 | 65 |
| 15 | $Y_{0.7}Ca_{0.3}Sr_{0.8}Ba_{1.2}Cu_{2.5}B_{0.5}O_{7.5}$ | 1.3 | 69 |
| 16 | $Y_{0.3}Gd_{0.3}Ca_{0.4}Sr_{0.8}Ba_{1.2}Cu_{2.7}B_{0.3}O_{7}$ | 1.9 | 90 |

TABLE 2

| Comparative Example No | Nominal Composition | Critical Current Density Ratio ($\alpha$) | Electrical characteristics (Tc) |
|---|---|---|---|
| 1 | $YBa_2Cu_3O_7$ | 1 | 92 K |
| 2 | $YSr_{0.8}Ba_{1.2}Cu_{2.5}B_{0.5}O_7$ | 0.01 | 51 K |
| 3 | $Y_{0.95}Ca_{0.05}Sr_{0.8}Ba_{1.2}Cu_{2.7}B_{0.3}O_7$ | 0.1 | 55 K |
| 4 | $Y_{0.4}Ca_{0.6}Sr_{0.8}Ba_{1.2}Cu_{2.7}B_{0.3}O_7$ | 0.2 | 59 K |
| 5 | $Y_{0.7}Ca_{0.3}Sr_{1.4}Ba_{0.6}Cu_{2.7}B_{0.3}O_7$ | 0 | 42 K |
| 6 | $Y_{0.7}Ca_{0.3}Sr_{0.2}Ba_{1.8}Cu_{2.7}B_{0.3}O_7$ | 0.7 | 81 K |
| 7 | $Y_{0.7}Ca_{0.3}Sr_{0.8}Ba_{1.2}Cu_{2.95}B_{0.05}O_7$ | 0.6 | 82 K |
| 8 | $Y_{0.7}Ca_{0.3}Sr_{0.8}Ba_{1.2}Cu_{2.4}B_{0.6}O_7$ | 0 | 35 K |
| 9 | $Y_{0.7}Ca_{0.3}Sr_{0.8}Ba_{1.2}Cu_{2.7}B_{0.3}O_6$ | 0 | semi-conducting |
| 10 | $Y_{0.7}Ca_{0.3}Sr_{0.8}Ba_{1.5}Cu_{2.7}B_{0.3}O_{7.7}$ | 0.5 | 80 K |
| 11 | $Y_{0.7}Ca_{0.3}Sr_{0.8}Ba_{1.2}Cu_3O_7$ | 0.7 | 82 K |
| 12 | $Ce_{0.7}Ca_{0.3}Sr_{0.8}Ba_{1.2}Cu_{2.7}B_{0.3}O_{7.5}$ | 0 | semi-conducting |
| 13 | $Tb_{0.7}Ca_{0.3}Sr_{0.8}Ba_{1.2}Cu_{2.7}B_{0.3}O_{7.5}$ | 0 | semi-conducting |
| 14 | $Sc_{0.7}Ca_{0.3}Sr_{0.8}Ba_{1.2}Cu_{2.7}B_{0.3}O_8$ | 0 | semi-conducting |

FIG. 1 is a graph indicating the temperature dependency of electric resistivity of the sample of Example 1.

As is seen from FIG. 1, the resistivity of the sample of Example 1 starts to lower at approximately 100K, that is, the sample starts a superconducting transition, and its resistivity is reduced to zero at 91K. It is thus verified that this sample shows the superconducting transition at a far higher temperature than a temperature of liquid nitrogen.

FIG. 2 is a schematic view of a layer structure as viewed in the vertical direction of the c-axis of the crystal structure of the sample of Example 1 which has been examined with TEM. It is seen from FIG. 2 that a part of Cu of the Cu-O chain is replaced by B.

EXAMPLES 17-28

$La_2O_3$, $Pr_6O_{11}$, $Nd_2O_3$, $Sm_2O_3$, $Eu_2O_3$, $Gd_2O_3$, $Dy_2O_3$, $Ho_2O_3$, $Er_2O_3$, $Tm_2O_3$, $Yb_2O_3$, $Lu_2O_3$, $CaCO_3$, $SrCO_3$, $BaCO_3$, CuO and $H_3BO_3$ used as starting materials were weighed at a suitable composition ratio and then dry-mixed. The resultant mixtures of the respective examples were reacted and sintered in a manner similar to the previous examples, thus preparing the metallic oxides of the present invention. These samples underwent measurements for electric resistivity and relative critical current density and EPMA analyses of the compositions under conditions similar to those of the previous examples. Comparative Example 1 was used as the base sample for these measurements and analyses as in the previous examples.

Table 3 shows the composition, the critical current density ratio $\alpha$ and the superconducting transition temperature Tc(K) of each of the examples.

As is seen from Table 3, all the metallic oxides of the present invention exhibit the superconducting transition at a temperature of Tc=60K or higher. Also, the relative critical current density of all the metallic oxides exceeds 1 under the condition of 50K. It is thus verified that the superconducting materials of the present invention are superior to the conventional Y-type materials. Further, it is confirmed that superconducting characteristics of the present invention are superior because the critical current density ratio is 1.5 or more, and the superconducting transition temperature exceeds 70K particularly when Ln is Gd, Dy, Ho or Er.

According to these examples 17–28 and the previous examples 1–16, it is confirmed that the transition temperature Tc exceeds 70K and the critical current density ratio is high when the composition is Ln=Y, Gd, Dy, Ho or Er, and the composition ratio is $0.2 \leq a \leq 0.4$, $1.0 \leq b \leq 1.4$ and $0.2 \leq c \leq 0.4$.

TABLE 3

| Example No. | Composition | Critical Current Density Ratio ($\alpha$) | Tc (K) |
|---|---|---|---|
| 17 | $La_{0.7}Ca_{0.3}Sr_{0.8}Ba_{1.2}Cu_{2.7}B_{0.3}O_7$ | 1.3 | 72 |
| 18 | $Pr_{0.7}Ca_{0.3}Sr_{0.8}Ba_{1.2}Cu_{2.7}B_{0.3}O_7$ | 1.1 | 61 |
| 19 | $Nd_{0.7}Ca_{0.3}Sr_{0.8}Ba_{1.2}Cu_{2.7}B_{0.3}O_7$ | 1.3 | 71 |
| 20 | $Sm_{0.7}Ca_{0.3}Sr_{0.8}Ba_{1.2}Cu_{2.7}B_{0.3}O_7$ | 1.3 | 74 |
| 21 | $Eu_{0.7}Ca_{0.3}Sr_{0.8}Ba_{1.2}Cu_{2.7}B_{0.3}O_7$ | 1.4 | 77 |
| 22 | $Gd_{0.7}Ca_{0.3}Sr_{0.8}Ba_{1.2}Cu_{2.7}B_{0.3}O_7$ | 1.7 | 85 |
| 23 | $Dy_{0.7}Ca_{0.3}Sr_{0.8}Ba_{1.2}Cu_{2.7}B_{0.3}O_7$ | 1.9 | 91 |
| 24 | $Ho_{0.7}Ca_{0.3}Sr_{0.8}Ba_{1.2}Cu_{2.7}B_{0.3}O_7$ | 1.9 | 91 |
| 25 | $Er_{0.7}Ca_{0.3}Sr_{0.8}Ba_{1.2}Cu_{2.7}B_{0.3}O_7$ | 1.6 | 79 |
| 26 | $Tm_{0.7}Ca_{0.3}Sr_{0.8}Ba_{1.2}Cu_{2.7}B_{0.3}O_7$ | 1.4 | 69 |
| 27 | $Yb_{0.7}Ca_{0.3}Sr_{0.8}Ba_{1.2}Cu_{2.7}B_{0.3}O_7$ | 1.3 | 65 |
| 28 | $Lu_{0.7}Ca_{0.3}Sr_{0.8}Ba_{1.2}Cu_{2.7}B_{0.3}O_7$ | 1.1 | 62 |

EXAMPLE 29

$Y_2O_3$, $CaCO_3$, $SrCO_3$, $BaCO_3$, CuO, $H_3BO_3$ and $B_2O_3$ used as starting materials were weighed at a suitable composition ratio to obtain the same composition as that of Example 1 and then dry-mixed. The resultant mixtures were pressure-molded into pellets each having a diameter of ∅ 10 mm and a thickness of 1 mm. The resultant moldings were sintered on an alumina boat under various firing conditions, and were compared.

The electric resistivity of each of these samples was measured in a range from room temperature to liquid helium temperature by a four-terminal method. Further, the critical current density of each of the samples was determined under the same conditions by measuring the susceptibility of SQUID or the DC four-terminal method, based on the critical current density of the typical Y-type material, that is, YBa$_2$Cu$_3$O$_7$ of Comparative Example 1, at 50K, for comparison. The resultant current density was indicated by the ratio α.

Nos. 1–4 of Table 4 show the conditions for a manufacturing process of the present invention, the critical current density ratio α and the superconducting transition temperature Tc(K) of the samples obtained by such manufacturing process.

As is seen from Table 4, all the materials of the present invention exhibit the superconducting transition at Tc=80K or higher and have a critical current density ratio of 2.0 or more. It is thus verified that the materials obtained by the process of the present invention are particularly superior.

TABLE 4

| No | Boron Starting Material | Temporary firing conditions | Final firing conditions | Critical Current Density Ratio (α) | Tc (k) |
|---|---|---|---|---|---|
| 1 | H$_3$BO$_3$ | | in oxygen 950° C. | 2.4 | 91 |
| 2 | H$_3$BO$_3$ | in air at 900° C. temperature rise speed = +5° C./min | in oxygen 1050° C. | 2.1 | 88 |
| 3 | H$_3$BO$_3$ | in air at 700° C. temperature rise speed = +5° C./min | in oxygen 900° C. | 2.1 | 87 |
| 4 | H$_3$BO$_3$ | in air at 800° C. temperature rise speed = +1° C./min | in oxygen 950° C. | 2.5 | 91 |
| 5 | H$_3$BO$_3$ | in air at 800° C. temperature rise speed = +20° C./min | in oxygen 950° C. | 1.7 | 87 |
| 6 | H$_3$BO$_3$ | in air at 800° C. temperature rise speed = +5° C./min | in oxygen 1100° C. | 1.2 | 71 |
| 7 | H$_3$BO$_3$ | in air at 800° C. temperature rise speed = +5° C./min | in oxygen 850° C. | 1.1 | 72 |
| 8 | H$_3$BO$_3$ | None | in oxygen 950° C. | 1.8 | 90 |
| 9 | B$_2$O$_3$ | None | in oxygen 950° C. | 1.7 | 88 |
| 10 | B$_2$O$_3$ | in air at 800° C. temperature rise speed = +5° C./min | in oxygen 950° C. | 1.8 | 88 |

As is clearly understood from the foregoing description, the present invention offers the following advantages.

(1) Since the materials of the present invention have high superconducting transition temperatures, that is, 60K or higher, and 90K or higher at an optimal composition, they can be used not only in liquid helium, but also in liquid nitrogen or a simple cooler.

(2) It becomes possible to inhibit a reduction in the critical current density caused by the weak link observed in the Y-type superconducting materials. The current density of the present invention is doubled or more in comparison with the material at a transition temperature of 50K, although it depends on the composition. With this advantage, the metallic oxide of the present invention is suitable for a material used in a superconducting wire.

While the present invention has been described with reference to what are presently considered to be the preferred examples, it is to be understood that the invention is not limited to the disclosed examples. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A metallic oxide composition of formula (I):

$$(Ln_{1-a}Ca_a)(Sr_{2-b}Ba_b)(Cu_{3-c}B_c)O_d \qquad (I)$$

wherein Ln is one or more elements selected from the group consisting of Y, La, Pr, Nd, Sm, Eu, Gd, Dy, Ho, Er, Tm, Yb and Lu; and
wherein the following conditions are met:
   $0.1 \leq a \leq 0.5$, $0.7 \leq b \leq 1.7$, $0.1 \leq c \leq 0.5$ and $6.5 \leq d \leq 7.5$;
   provided that $c \geq 0.4$ only when $a \geq 0.3$.

2. A metallic oxide according to claim 1, wherein Ln is one of Y, Gd, Dy, Ho and Er in said formula (I).

3. A metallic oxide according to claim 1, wherein Ln is one of Y, Gd, Dy, Ho and Er in said formula (I) and wherein the following conditions are met:

$0.2 \leq a \leq 0.4$, $1.0 \leq b \leq 1.4$ and $0.2 \leq c \leq 0.4$.

4. A metallic oxide according to one of claims 1, 2 and 3, wherein the superconducting transition temperature is 80K or higher and the critical current density ratio is 2 or greater.

5. A process for manufacturing a metallic oxide composition of formula (I):

$$(Ln_{1-a}Ca_a)(Sr_{2-b}Ba_b)(Cu_{3-c}B_c)O_d \qquad (I)$$

wherein Ln is one or more elements selected from the group consisting of: Y, La, Pr, Nd, Sm, Eu, Gd, Dy, Ho, Er, Tm, Yb and Lu; and wherein the following conditions are met:
   $0.1 \leq a \leq 0.5$, $0.7 \leq b \leq 1.7$, $0.1 \leq c \leq 9.5$ and $6.5 \leq d \leq 7.5$;
   provided that $c \geq 0.4$ only when $a \geq 0.3$ comprising the steps of:
   (a) preparing a mixture of starting materials comprising Ln, Ca, Sr, Ba, Cu and H$_3$BO$_3$;
   (b) heating said mixture at a rate up to 5° C. per minute and to a maximum of not more than 900° C.; and (c) then heating said mixture in an oxygen atmosphere at from 900° C. to 1050° C.

6. A process for manufacturing a metallic oxide according to claim 5, wherein Ln is one of Y, Gd, Dy, Ho and Er in said formula (I).

7. A process for manufacturing a metallic oxide according to claim 5, wherein Ln is one of Y, Gd, Dy, Ho and Er and the following conditions are met in said formula (I):

$0.2 < a < 0.4$, $1.0 \leq b \leq 1.4$ and $0.2 \leq c \leq 0.4$

8. A process for manufacturing a metallic oxide according to one of claims 6, 7 and 5, wherein said metallic oxide has a superconducting transition temperature of 80K or higher and a critical current density ration of 2 or greater.

* * * * *

UNITED STATES PATENT AND TRADEMARK OFFICE
CERTIFICATE OF CORRECTION

PATENT NO. : 5,512,542

DATED : April 30, 1996

INVENTORS : TOHRU DEN ET AL.

It is certified that error appears in the above-identified patent and that said Letters Patent is hereby corrected as shown below:

COLUMN 2

Line 32, "Bard" should read --B and--.

COLUMN 3

Line 28, "likely" should read --are likely--.

COLUMN 4

Line 34, "$0.7 \leq b \leq 0.7$, $01 \leq c \leq 0.5$ and $6.5 > d \leq 7.5$" should read --$0.7 \leq b \leq 1.7$, $0.1 \leq c \leq 0.5$, and $6.5 \leq d \leq 7.5$--;

Line 55, "($a \geq 1.5$," should read --$a \geq 1.5$--.

COLUMN 5

Line 64, "$Sc_2\ O_3$," should read --$Sc_2O_3$,--.

COLUMN 7

Table 1  In Example No. 11, "$B_{0.1}$" should read --$B_{0.2}$--.

UNITED STATES PATENT AND TRADEMARK OFFICE
CERTIFICATE OF CORRECTION

PATENT NO.  : 5,512,542

DATED       : April 30, 1996

INVENTORS : TOHRU DEN ET AL.

It is certified that error appears in the above-identified patent and that said Letters Patent is hereby corrected as shown below:

COLUMN 10

Line 60, "$0.1 \leq C \leq 9.5$" should read --$0.1 \leq C \leq 0.5$--;
Line 61, "$a \geq 0.3$" should read --$a \geq 0.3$,--.

COLUMN 12

Line 1    "$0.2 < a < 0.4$," should read --$0.2 \leq a \leq 0.4$,--;
Line 6,   "ration" should read --ratio--.

Signed and Sealed this

First Day of October, 1996

Attest:

BRUCE LEHMAN

*Attesting Officer*     *Commissioner of Patents and Trademarks*